United States Patent [19]
Kaji et al.

[11] Patent Number: 5,895,586
[45] Date of Patent: Apr. 20, 1999

[54] PLASMA PROCESSING APPARATUS AND PLASMA PROCESSING METHOD IN WHICH A PART OF THE PROCESSING CHAMBER IS FORMED USING A PRE-FLUORINATED MATERIAL OF ALUMINUM

[75] Inventors: Tetsunori Kaji, Tokuyama; Saburo Kanai, Hikari; Satoshi Ito, Hikari; Ryoji Hamasaki, Hikari; Tetsuo Ono, Kokubunji; Tatehito Usui, Chiyoda-machi; Kazue Takahashi, Kudamatsu; Kazutami Tago, Hitachinaka, all of Japan

[73] Assignee: Hitachi, Ltd., Tokyo, Japan

[21] Appl. No.: 08/737,520

[22] PCT Filed: May 17, 1995

[86] PCT No.: PCT/JP95/00935

§ 371 Date: Nov. 12, 1996

§ 102(e) Date: Nov. 12, 1996

[87] PCT Pub. No.: WO95/31822

PCT Pub. Date: Nov. 23, 1995

[30] Foreign Application Priority Data

May 17, 1994 [JP] Japan ................ 6-102453

[51] Int. Cl.$^6$ ................................. B23K 10/00
[52] U.S. Cl. ............... 219/121.43; 219/121.4; 219/121.42; 156/345; 118/723 R
[58] Field of Search ............... 219/121.4, 121.42, 219/121.43, 121.44, 121.48; 156/345, 643.1, 646.1; 118/723 R; 216/67–72

[56] References Cited

U.S. PATENT DOCUMENTS

| | | | |
|---|---|---|---|
| 5,158,644 | 10/1992 | Cheung et al. | 156/643 |
| 5,221,414 | 6/1993 | Langley et al. | 156/626 |
| 5,272,417 | 12/1993 | Ohmi | 315/111.21 |
| 5,366,585 | 11/1994 | Robertson et al. | 156/643 |
| 5,443,680 | 8/1995 | Jones et al. | 216/37 |
| 5,532,447 | 7/1996 | Powers | 219/121.43 |
| 5,585,012 | 12/1996 | Wu et al. | 216/71 |

FOREIGN PATENT DOCUMENTS

| | | |
|---|---|---|
| 57-52423 | 11/1982 | Japan . |
| 0221620 | 1/1990 | Japan . |
| 2101740 | 4/1990 | Japan . |
| 4191379 | 7/1992 | Japan . |
| 4354330 | 12/1992 | Japan . |
| 5243167 | 9/1993 | Japan . |

*Primary Examiner*—Mark H. Paschall
*Attorney, Agent, or Firm*—Antonelli, Terry, Stout & Kraus, LLP

[57] ABSTRACT

There are provided a plasma processing apparatus and a plasma processing method which are suitable for processing a processed substance using a gas plasma containing fluorine atoms.

Structural materials used for a high vacuum processing chamber of a plasma processing apparatus are aluminum, aluminum having an anodic oxide coating processed surface and a material having a film of aluminum oxide or a film having aluminum oxide as a main component. A part or the whole of the inner surfaces of the processing chamber is constructed with a pre-fluorinated material.

When plasma processing of a processed substance is performed using a gas plasma containing fluorine atoms in the processing chamber having the pre-fluorinated inner surfaces, time-varying processing characteristic can be suppressed.

5 Claims, 2 Drawing Sheets

PLASMA PROCESSING APPARATUS AND PLASMA PROCESSING METHOD IN WHICH A PART OF THE PROCESSING CHAMBER IS FORMED USING A PRE-FLUORINATED MATERIAL OF ALUMINUM

BACKGROUND OF THE INVENTION

The present invention relates to a plasma processing apparatus and a plasma processing method for processing a processed substance utilizing plasma produced by a plasma etching apparatus, a plasma chemical vapor deposition apparatus or the like.

In this specification, the term "aluminum material" means pure aluminum and aluminum alloys.

Since high corrosive gases such as chlorine gas and the like are used in a vacuum processing chamber of a plasma processing apparatus such as a plasma etching apparatus, a plasma chemical vapor deposition apparatus or the like, the vacuum processing chamber has been made of a highly corrosion resistant material such as stainless steel, quartz glass, aluminum oxide ceramic and so on. An apparatus of this kind is disclosed, for example, in Japanese Patent Application Laid-Open No.62-103379.

In a case of employing a stainless steel for a vacuum processing chamber of a plasma processing apparatus, the stainless steel itself releases its composite elements of Fe, Ni, Co and so on by impact of charged particles in a plasma. Therefore, in a semiconductor device manufacturing process, there has been a problem of heavy metal contamination.

On the other hand, the problem of heavy metal contamination can be solved by using a quartz glass cover, but the processing characteristic is sometimes changed because temperature of the quartz glass cover is increased over time by impact and thermal radiation of the plasma. In such a case, it is effective to heat or to cool the quartz glass cover using some means, but in most cases there are structural and technological difficulties because the quartz glass is exposed to vacuum and plasma in the plasma processing apparatus.

There is an aluminum material as a material which does not have the problem of heavy metal contamination and has better workability including heating or cooling. However, in this case, there is a problem in that the aluminum material does not have corrosion resistance against a gas plasma containing chlorine atoms or bromine atoms used in a plasma processing apparatus. For a countermeasure of the problem, a method is disclosed, for example, in Japanese Patent Application Laid-Open No.62-103379 where a highly corrosion resistant film made of Al2O3, AlC, TiN, TiC, AlN or the like is formed on the surface of an aluminum material structure through some means.

However, in a plasma processing apparatus using a gas containing fluorine atoms, no countermeasure has been taken against time-varying processing characteristic due to fluorination of the material itself composing the processing chamber.

SUMMARY OF THE INVENTION

An object of the present invention is to provide a plasma processing apparatus and a plasma processing method which is capable of performing stable processing by suppressing time-varying processing characteristic due to progress of fluorination in a plasma process using a gas containing fluorine atoms.

In order to prevent fluorination of the surface of the processing chamber by a plasma using a gas containing fluorine atoms, the surface of the plasma processing chamber is made of a material containing fluorine in advance.

When a part or the whole inside surface of the processing chamber is made of a material containing fluorine atoms, progressing speed of fluorinating the inside surface of the processing chamber by a plasma process using a gas containing fluorine atoms is decreased. As a result, an amount of fluorine absorbed into the surface of the processing chamber is decreased, and at the same time the state change of the inside surface of the processing chamber becomes small and the qualitative and quantitative change of substances attached on the inside surface of the processing chamber becomes small. Thereby, it is possible to lessen fluctuation in processing each of samples when the sample is performed with plasma processing. Therefore, it is possible to reduce the time-varying characteristic of plasma processing and to perform a stable processing to each sample.

DETAILED DESCRIPTION OF THE PREFERRED EMBODIMENTS

Figure 1:
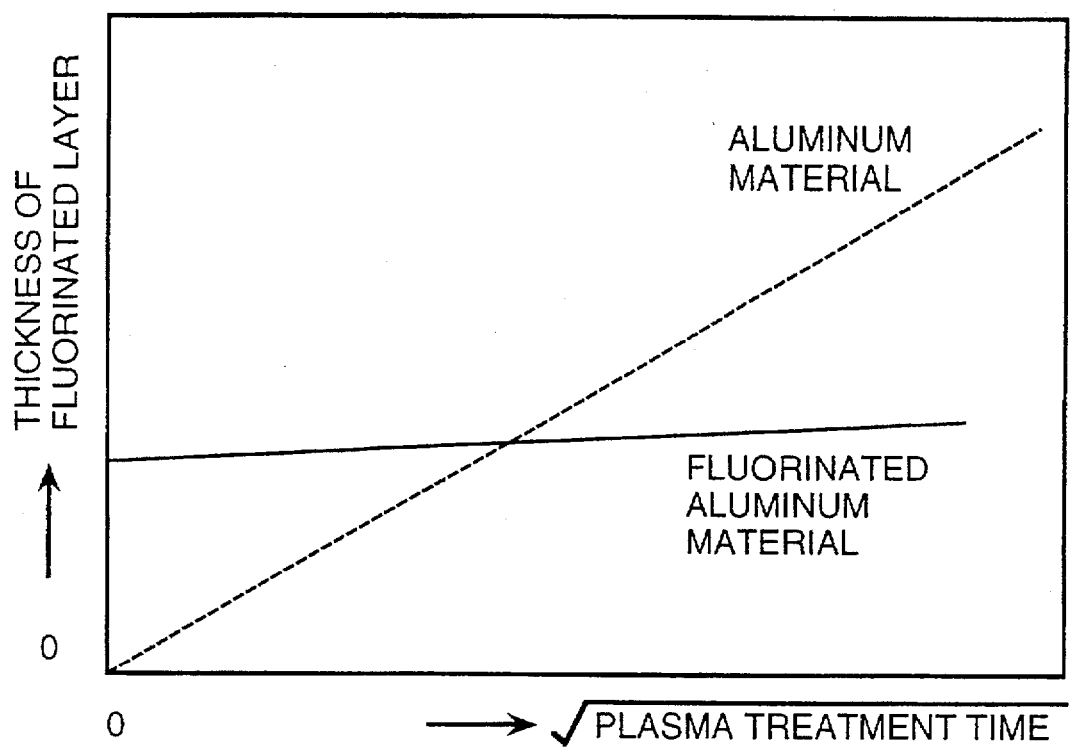
FIG. 1 is a graph showing the relationship between thickness of fluorinated layer and plasma processing time for various aluminum material surfaces.

An embodiment of the present invention will be described in detail below. FIG. 1 shows thickness of fluorinated layer on each of the surfaces for an aluminum material and a pre-fluorinated aluminum material which is exposed to a high frequency plasma. It can be understood that the fluorinated speed of the aluminum material without pre-fluorination is larger than that of the pre-fluorinated aluminum material.

Figure 2:
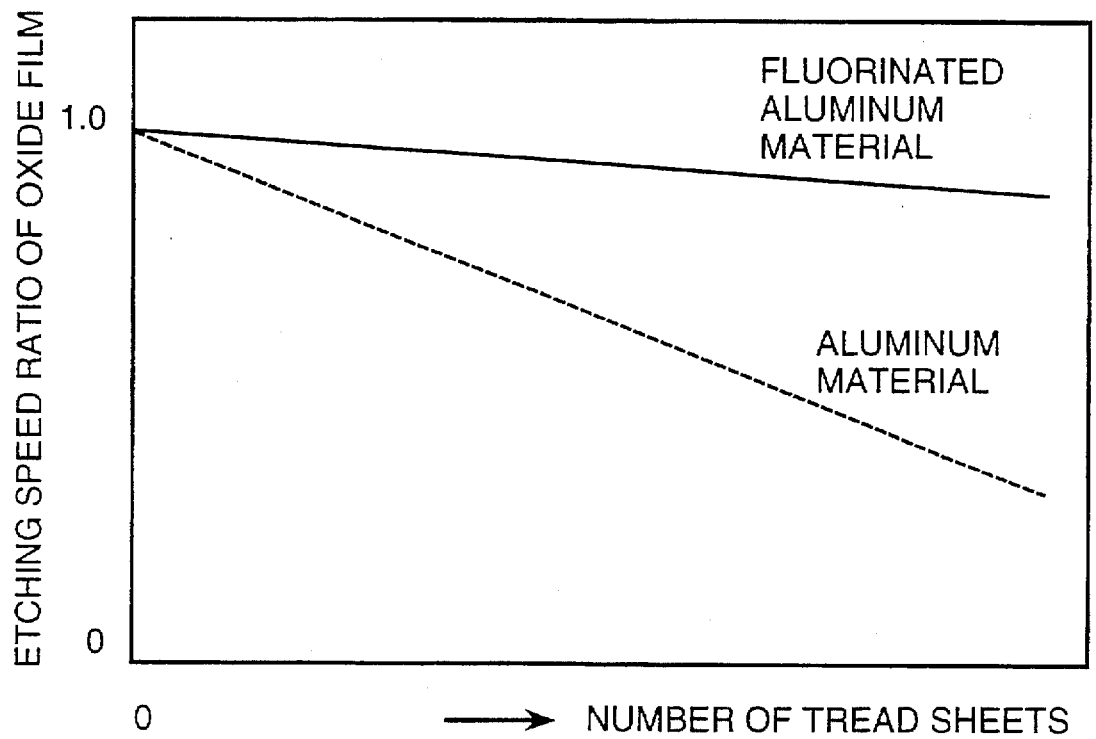
FIG. 2 is a graph showing the dependence of time-variation of etching speed ratio of oxide film on surface treatment of a processing chamber.

FIG. 2 shows time-variations of average etching speed ratio of oxide film when a silicon oxide film is plasma-processed by CHF3 gas to form a hole using the same chamber materials as those in FIG. 1. Each of the average etching speeds is normalized by setting the initial value at starting of processing to 1 (one). By employing the pre-fluorinated aluminum material to a processing chamber, the time-varying decrease in etching speed of oxide film can be substantially reduced. When a gas such as CnFm (n, m are integers), SF6, a gas containing fluorine or a gas containing fluorine mixed with another gas other than CHF3 is used as the gas used for processing a sample, the time-varying decrease in etching speed of oxide film can be substantially reduced. When the thickness of the fluorinated film on the inside surface of the processing chamber is larger, the effect of preventing the etching speed from decreasing becomes larger. It is preferable that an electric resistance between two point on the inside surface of the processing chamber is more than 100 times as large as that of an aluminum material without pre-fluorination. Especially, when the pre-fluorinated surface is formed in or near a state of insulator, the time-varying of the processing characteristic can be more reduced.

Figure 3:
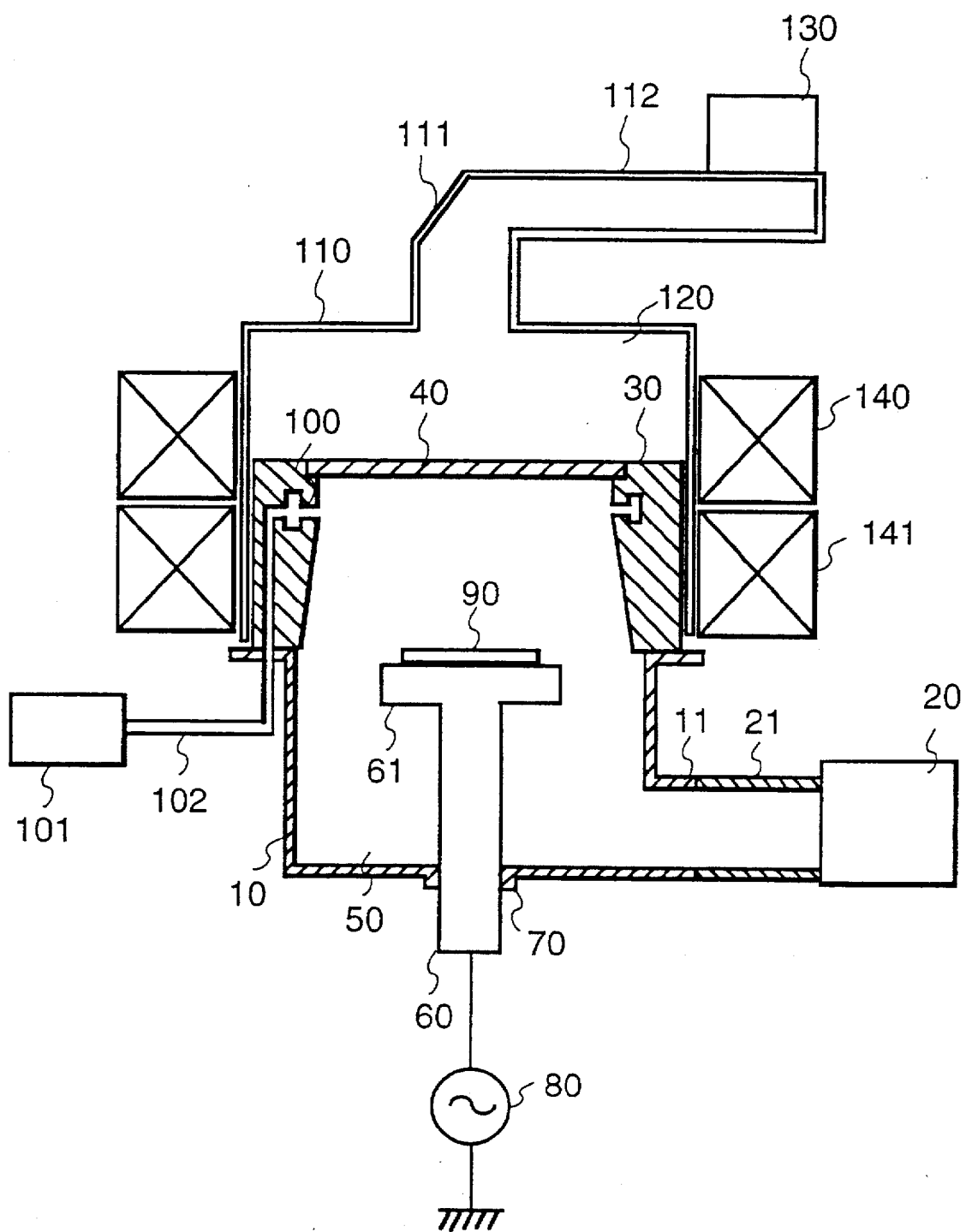
FIG. 3 is a vertical cross-sectional view showing the construction of an embodiment of a plasma processing apparatus to which the present invention is applied.

FIG. 3 is a vertical cross-sectional view showing the construction of a main portion of a microwave plasma etching apparatus which is used for obtaining the characteristic of FIG. 2.

Referring to FIG. 3, a vacuum vessel 10 has a top-opened construction. The vacuum vessel 10 is made of, for example, aluminum. In this case, the shape of the top of the vacuum vessel 10 is nearly circular when seeing from the top. An exhausting nozzle 11 is formed in the bottom portion on the side wall of the vacuum vessel 10. A vacuum exhausting apparatus 20 is installed outside the vacuum vessel 10. The exhausting nozzle 11 and a suction port of the vacuum exhausting apparatus 20 are connected with an exhausting pipe 21. The exhausting pipe 21 has a closing valve (not shown), a valve for varying the exhausting resistance (not shown) and so on.

In FIG. 3, a discharge block 30 of means having a plasma generating region inside, and the shape is of a hollow cylinder having a cross-sectional area being small in change in the transmitting direction of microwave. The hollow cylinder is made of a material non-permeable to microwave, in this case, formed of an aluminum cylinder having a pre-fluorinated inside surface. The discharging block 30 is installed so as to set the center axis of the inside hollow portion nearly vertical, and the inside hollow portion is hermetically installed on the top of the vacuum vessel 10 by communicating with the vacuum vessel 10 through the top open portion of the vacuum vessel 10. On the top of the discharging block 31, there is provided a microwave transmitting window 40 of which the inside hollow portion is hermetically sealed. The microwave transmitting window 40 is made of a material permeable to microwave such as quartz, aluminum oxide or the like. That is, a space 50 isolated from the external is formed by the vacuum vessel 10, the inside hollow portion of the discharging block 30 and the microwave transmitting window 40.

Referring to FIG. 3, a sample table shaft 60 is projected in the space 50 in the top and outside the vacuum vessel 10 in the bottom, and the bottom wall of the vacuum vessel 10 and the sample table shaft 60 are electrically insulated with an electric insulating member 70. A sample table 61 has a sample mounting surface on one side, in this case, on the upper surface. The sample table 61 is placed on the top of the sample table shaft 60 so as to set the sample mounting surface nearly horizontal. Of cause, the sample table shaft 60 and the sample table 61 may be formed in a one-piece structure. In this embodiment, a high frequency electric power source 80 of bias electric power source is placed outside the space 50. The sample table shaft 60 is connected to the high frequency electric power source 80. The electric power source 80 is grounded. The sample table shaft 60 and the sample table 61 are made of a electrical conductive material, and the sample table 61 and the sample table shaft 60 are in a conductive state. On the other hand, the vacuum vessel 10 is grounded and the discharge block 30 is also grounded through the vacuum vessel 10 in this embodiment. A direct current electric power source instead of the high frequency electric power source 80 may be used as the bias electric power source. Further, in this embodiment, a coolant passage (not shown) is formed inside the sample table 61 and a coolant supply passage (not shown) and a coolant discharge passage (not shown) respectively communicating with the coolant passage are formed inside the sample table shaft 60. A coolant supply apparatus (not shown) is provided outside the space 50. A coolant supply port of the coolant supply apparatus and the coolant supply passage of the sample table shaft 60 are connected with a coolant supply pipe (not shown). One end of a coolant discharge pipe (not shown) is connected to the coolant discharge passage of the sample table shaft 60, and the other end is connected to a coolant recovery tank (not shown) or released to atmosphere.

In FIG. 3, the microwave transmitting window 40 and the sample mounting surface of the sample table 61 are opposite to each other, that is, in a case where a sample 90 such as a semiconductor element substrate is mounted on the sample mounting surface, the microwave transmitting window and the processed surface are opposite to each other in the vertical direction and the surfaces are nearly parallel to each other. It is preferable to construct in such that the central axis of the inside hollow portion of the discharge block 30, the center of the microwave transmitting window 40 and the center of the sample mounting surface of the sample table 61, that is, the center of the processed surface of the sample 90 agree with one another.

Referring to FIG. 3, a gas supply passage 100 is formed inside the discharging block 30. A process gas source 101 is placed outside the space 50. The process gas source 101 and one end of the gas supply passage 100 are connected with a gas supply pipe 102. A closing valve (not shown), a gas flow rate controller (not shown) and so on are provided in the gas supply pipe 102. On the other end of the gas supply passage 100 is opened to the inside hollow portion of the discharging block 30 between the top portion and the middle portion in the height direction of the discharging block 30.

Referring to FIG. 3, outside the discharging block 30, a wave-guide 110 is provided in a state of containing the block 30 inside. The wave-guide 110 is terminated at the vacuum vessel 10. The shape of the wave-guide 110 is nearly cylindrical in this embodiment. Between the top wall of closing end wall of the wave-guide 110 and the upper end portion of the discharging block 30 (the upper surface of the microwave transmitting window 40), a spsce 120 having a certain eight (spacing) is formed. In this embodiment, an opening is formed in the portion of the top wall of the wave-guide 110 opposite to the upper surface of the microwave transmitting window 40. It is not always necessary to provide the opening at that portion. Outside the space 50 and the space 120, there is provided a magnetron 130 which is a means for oscillating a microwave. The magnetron 130 and the wave-guide 110 are connected with wave-guides 111, 112. The inside of the wave-guides 111, 112 is communicated with the space 120 through the opening on the top wall of the wave-guide 110. The wave-guide 111 is a wave-guide of rectangle-to-circle right angle transducer, and the wave-guide 112 is a rectangular wave-guide. The magnetron 130 and the wave-guide 110 may be connected using another microwave transmitting means such as a coaxial cable or the like.

Referring to FIG. 3, in the outer periphery of the side wall of the wave-guide 110, there are arranged hollow coils 140, 141 of means for generating a magnetic field in two stages in this embodiment. The hollow coil 140 corresponds nearly to the outer peripheral wall of the space 120 and the hollow coil 141 corresponds nearly to the outer peripheral wall of the discharging block 30. Each of the hollow coils 140, 141 is connected to a electric power source (not shown) through an ON-OFF means (not shown) and a current flow regulating means (not shown).

Referring to FIG. 3, by opening the closing valve and the exhaust resistance variable valve and operating the vacuum exhausting apparatus 20, the space 50 is depressurized and evacuated. Further, by opening the gas supply passage 100 such as the gas supply pipe 102, the closing valve, the gas flow rate controller, a predetermined etching gas is introduced into the inside follow portion of the discharging block 30 from the process gas source 101 with a preset flow rate. That is, the etching gas is introduced in the space 50. By adjusting valve opening of the exhausting resistance variable valve, a part of the etching gas introduced into the space 50 is exhausted by the vacuum exhausting apparatus 20, and thereby the pressure in the space 50 is adjusted to a preset etching processing pressure.

Further, referring to FIG. 3, in this embodiment, a sample 90 is loaded inside the vacuum vessel 10 using a transferring means (not shown) known in the art. The transferring means having transferred the sample 90 loaded in the vacuum vessel 10 is stored in a place so as to not interfering with processing of the sample 90. The sample 90 transferred to the sample table 61 is placed on the sample mounting surface of the sample table in directing the processed surface upward. Then the hollow coils 140, 141 are energized to apply a magnetic field in the inside hollow portion of the discharging block 30.

Although the plasma is generated using a microwave in FIG. 3, the present invention does not limit any specified plasma generating means. It is no need to say that the present invention con be applied to a case where plasma is generated using a high frequency wave.

A method of fluorinating the inside surface of the processing chamber comprises the steps of (1) heating the structural members of the processing chamber to a temperature of 200° C. to 600° C. and flowing a gas containing fluorine, and (2) generating a plasma using the gas containing fluorine and placing the structural members of the processing chamber in the atmosphere of the plasma.

Even in a case where a processing chamber is constructed using a material having pre-fluorinated surfaces, attached substances are gradually deposited onto the inner surface of the processing chamber when a plasma is generated using a gas containing fluorine to perform plasma processing. Therefore, it is necessary to perform cleaning every time processing one sample or several samples even when the processing chamber is processing chamber is constructed using a material having fluorinated surfaces constructed using a material having pre-fluorinated surfaces. As for the cleaning, it is preferable to use a gas containing oxygen.

Although the description has been made on a case where aluminum is employed as the material for the processing chamber, the material is not limited to aluminum. The same effect can be attained by using aluminum with an anodic oxide coating processed surface, aluminum with an alumina film or a film having alumina as a main component (mullite or the like), or other metals or other insulators (film and single body). In a case of using an insulator, the same effect can be attained by an small amount of fluorinating treatment.

Although description has been made in FIG. 2 on a case of silicon oxide film as a sample, the same effect can be attained in a silicon nitride film.

According to the present invention, in a plasma processing apparatus using gas plasma containing fluorine, variation in processing characteristic due to progress in fluorinating of the structural material of a processing chamber can be decreased and the reliability of the apparatus can be improved.

What is claimed is:

1. A plasma processing method, which comprises the steps of:

forming at least a part of an inner surface of a processing chamber using a pre-fluorinated material of aluminum, wherein a surface electric resistivity of the pre-fluorinated material of aluminum is more than 100 times as large as the surface electric resistivity of the material of aluminum not pre-fluorinated, performing plasma processing of a sample using a gas containing fluorine atoms, and performing cleaning processing of the processing chamber using a gas containing oxygen.

2. A plasma processing apparatus for processing of a sample using a gas containing fluorine atoms, comprising a processing chamber having an inner surface formed using a pre-fluorinated material of aluminum, wherein a surface electric resistivity of the pre-fluorinated material of aluminum is more than 100 times as large as the surface electric resistivity of the material of aluminum not pre-fluorinated.

3. A plasma processing apparatus according to claim 2, wherein said pre-fluorinated material of aluminum is a pre-fluorinated material of aluminum having a film containing an aluminum oxide component on the surface.

4. A plasma processing apparatus according to claim 2, wherein the pre-fluorinated material of aluminum is pre-fluorinated pure aluminum.

5. A plasma processing apparatus according to claim 2, wherein the pre-fluorinated material of aluminum is a pre-fluorinated aluminum alloy.

* * * * *